United States Patent
Lin et al.

(10) Patent No.: US 9,666,548 B2
(45) Date of Patent: May 30, 2017

(54) METHOD OF FABRICATING CONNECTION STRUCTURE FOR A SUBSTRATE

(71) Applicant: Siliconware Precision Industries Co., Ltd., Taichung (TW)

(72) Inventors: Chih-Sheng Lin, Taichung (TW); Chun-Lung Chen, Taichung (TW); Hsin-Hung Lee, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 63 days.

(21) Appl. No.: 14/683,716

(22) Filed: Apr. 10, 2015

(65) Prior Publication Data
US 2015/0214169 A1    Jul. 30, 2015

Related U.S. Application Data

(62) Division of application No. 13/729,710, filed on Dec. 28, 2012, now abandoned.

(30) Foreign Application Priority Data

Nov. 15, 2012 (TW) .............................. 101142584 A

(51) Int. Cl.
  *C25D 5/02* (2006.01)
  *H01L 23/00* (2006.01)
  (Continued)

(52) U.S. Cl.
  CPC .............. *H01L 24/11* (2013.01); *C23C 14/34* (2013.01); *C25D 5/02* (2013.01); *C25D 7/12* (2013.01);
  (Continued)

(58) Field of Classification Search
  CPC ..... H01L 23/12; H01L 23/3114; H01L 23/48; H01L 24/06; H01L 24/11; H01L 24/14;
  (Continued)

(56) References Cited

U.S. PATENT DOCUMENTS 6,015,652 A    1/2000 Ahlquist et al.
6,940,169 B2 *  9/2005 Jin .......................... H01L 24/11
                                                          257/737

(Continued)

*Primary Examiner* — Carl Arbes
(74) *Attorney, Agent, or Firm* — Mintz Levin Cohn Ferris Glovsky and Popeo, P.C.; Peter F. Corless; Steven M. Jensen

(57) ABSTRACT

A connection structure for a substrate is provided. The substrate has a plurality of connection pads and an insulation protection layer with the connection pads being exposed therefrom. The connection structure includes a metallic layer formed on an exposed surface of each of the connection pads and extending to the insulation protection layer, and a plurality of conductive bumps disposed on the metallic layer and spaced apart from one another at a distance less than or equal to 80 μm, each of conductive bumps having a width less than a width of each of the connection pads. Since the metallic layer covers the exposed surfaces of the connection pads completely, a colloid material will not flow to a surface of the connection pads during a subsequent underfilling process of a flip-chip process. Therefore, the colloid material will not be peeled off from the connection pads.

8 Claims, 4 Drawing Sheets

(51) Int. Cl.
*H05K 1/11* (2006.01)
*H05K 3/40* (2006.01)
*C23C 14/34* (2006.01)
*C25D 7/12* (2006.01)

(52) U.S. Cl.
CPC .............. *H01L 24/06* (2013.01); *H01L 24/14* (2013.01); *H05K 1/111* (2013.01); *H05K 3/4007* (2013.01); *H01L 2224/03001* (2013.01); *H01L 2224/0401* (2013.01); *H01L 2224/11001* (2013.01); *H01L 2924/01029* (2013.01); *H05K 2201/0338* (2013.01); *H05K 2201/0367* (2013.01); *Y10T 29/49124* (2015.01)

(58) Field of Classification Search
CPC . H01L 2224/03001; H01L 2224/11001; H01L 2924/01029; H01L 2224/0401; C23C 5/02; C23C 14/34; C25D 5/02; C25D 7/12; H05K 1/111; H05K 3/4007; H05K 2201/0338; H05K 2201/0367; Y10T 29/49124

See application file for complete search history.

(56) References Cited

U.S. PATENT DOCUMENTS

| | | | |
|---|---|---|---|
| 2006/0051954 A1 | 3/2006 | Lin et al. | |
| 2010/0044084 A1 | 2/2010 | Lee et al. | |
| 2011/0024905 A1* | 2/2011 | Lin | H01L 23/49816 257/738 |
| 2011/0227216 A1 | 9/2011 | Tseng et al. | |
| 2011/0291274 A1* | 12/2011 | Meyer | H01L 21/568 257/738 |
| 2013/0062764 A1* | 3/2013 | Jin | H01L 23/3114 257/738 |

* cited by examiner

METHOD OF FABRICATING CONNECTION STRUCTURE FOR A SUBSTRATE

CROSS-REFERENCE TO RELATED APPLICATIONS

This application is a divisional of copending U.S. application Ser. No. 13/729,710, filed on Dec. 28, 2012, which claims under 35 U.S.C. §119(a) the benefit of Taiwanese Application No. 101142584, filed Nov. 15, 2012, the entire contents of which are incorporated herein by reference.

BACKGROUND OF THE INVENTION

1. Field of the Invention

This invention relates to connection structures, and, more particularly, to a connection structure in a semiconductor package.

2. Description of Related Art

In a flip-chip packaging process, a semiconductor element is disposed on and electrically connected to a package substrate via solder bumps, and the package substrate and the semiconductor element are packaged. Therefore, both the semiconductor element and the package substrate have connection pads disposed thereon for the package substrate to be electrically connected to the semiconductor element (chip) via the solder bumps.

As shown in FIG. 1, a substrate 30 (e.g., a package substrate or a semiconductor chip) has a plurality of aluminum connection pads 300 (only one of the connection pads 300 is shown here to represent all of the connection pads 300), and an insulation protection layer 31 made of polyimide is formed on the substrate 30 and exposes the connection pads 300. A patterning process is performed on an exposed surface of the connection pads 300, i.e., forming a metallic layer 11 composed of a titanium portion 11a, a copper portion 11b and a nickel portion 11c to act as an under bump metallurgy (UBM). Then, conductive bumps 12 are disposed on the nickel layer 11c, and a solder tin material 13 is formed on the conductive bumps 12 and reflowed to form solder bumps that act as a connection structure 1 that electrically connects the package substrate with the semiconductor chip.

In the connection structure 1, since the metallic layer 11 does not cover the entire exposed surface of the connection pads 300 and the titanium portion 11a in the metallic layer 11 is bonded to the polyimide (i.e., the insulation protection layer 31) securely, the titanium portion 11a cannot be removed completely from a surface of the insulation protection layer 31 when an excessive metal material is etched and removed (i.e., the patterning process), and a residual titanium metal stays on the insulation protection layer 31. As a result, an electrical leakage phenomenon occurs at the connection structure 1 when the chip is in operation after the package substrate is flip-chipped on and bonded to the chip, and the electrical function of the overall package is affected.

Since the metallic layer 11 does not cover the entire exposed surface of the connection pads 300, a colloid material is likely to flow to the surface of the connection pads 300 during the subsequent underfill step of a flip-chip process, and the colloid material is likely to be peeled off from the substrate 30. As a result, the connection structure 1 is cracked, and the reliability of an electronic product is affected.

In order to address the compact-size and low-profile requirements for an electronic product, the substrate 30 is designed to have small pitches. For example, a distance between any two of the conductive bumps 12 is limited to be equal to or less than 80 µm. Such a small pitch results in the electrical leakage phenomenon and the connection structure 1 is more likely to be cracked, which is contradictory to the miniature design.

Therefore, how to overcome the problems of the prior art is becoming an urgent issue in the art.

SUMMARY OF THE INVENTION

In view of the drawbacks of the prior art, the present invention provides a connection structure for a substrate, the substrate having a plurality of connection pads and an insulation protection layer that exposes the connection pads, the connection structure comprising: a metallic layer formed on exposed surfaces of the connection pads and extending to the insulation protection layer; and a plurality of conductive bumps disposed on the metallic layer and spaced apart from one another at a distance less than or equal to 80 µm, each of conductive bumps having a width less than a width of each of the connection pads.

The present invention further provides a method of fabricating a connection structure for a substrate, comprising: providing a substrate having a plurality of connection pads, and an insulation protection layer with the connection pads being exposed therefrom; forming on the insulation protection layer a first resist layer having a plurality of first openings for the connection pads and a portion of the insulation protection layer to be exposed therefrom; forming a metallic structure in the first openings and on the first resist layer; removing the metallic structure on the first resist layer, allowing the metallic structure to be disposed in the first openings only and act as a metallic layer, the metallic layer being thus formed on an exposed surface of each of the connection pads and extending to the insulation protection layer; removing the first resist layer; and forming a plurality of conductive bumps on the metallic layer, each of the conductive bumps having a width less than a width of the exposed surface of each of the connection pads.

In an embodiment, a distance between any two of the conductive bumps is less than or equal to 80 µm.

In an embodiment, the first resist layer is made of aluminum, copper or nickel/vanadium, and the opening of the first resist layer is formed by etching.

In an embodiment, the conductive bumps are fabricated by: forming a second resist layer on the insulation protection layer and the metallic layer, and forming on the second resist layer a plurality of second openings for a portion of the metallic layer to be exposed therefrom; forming the conductive bumps in the second openings; and removing the second resist layer.

In an embodiment, the radius size of the second openings is less than the projection area of the exposed surfaces of the connection pads.

In an embodiment, the metallic layer comprises titanium, copper or nickel.

In an embodiment, the conductive bumps are copper pillars.

In a connection structure of a substrate and a method of fabricating the connection structure according to the present invention, since the metallic layer covers the entire exposed surfaces of the connection pads and the first resist layer is formed between the metallic structure and the insulation protection layer, only the metal material disposed on the first resist layer needs to be removed when the metallic structure is etched and removed. As a result, no residual metal, except the metallic layer, will remain on the insulation protection layer. Therefore, when a chip is flip-chipped on and bonded to a package substrate, the electrical leakage phenomenon is prevented from occurring at the connection structure.

Besides, since the metallic layer covers the entire exposed surface of the connection pads, a colloid material will not flow to a surface of the connection pads during a subsequent underfill process, and will not be peeled off from the substrate. Therefore, the connection structure is not cracked and the reliability of an electronic product is not affected.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A to 2H are cross-sectional diagrams illustrating a method of fabricating a connection structure 2 for a substrate 30 according to the present invention.

Figure 1:
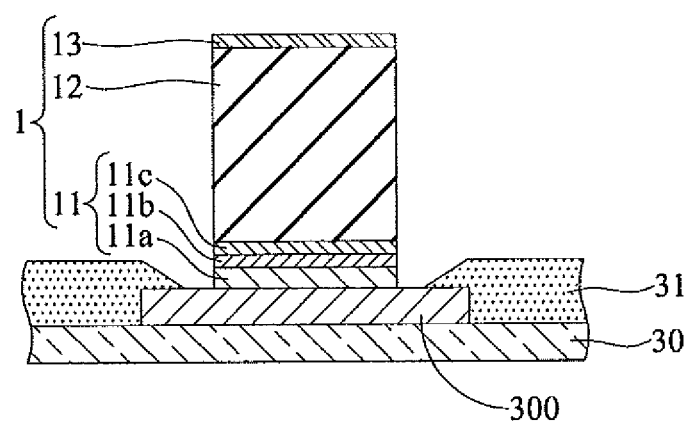
FIG. 1 is a cross-sectional diagram illustrating a connection structure for a substrate according to the present invention.
Figure 2A:
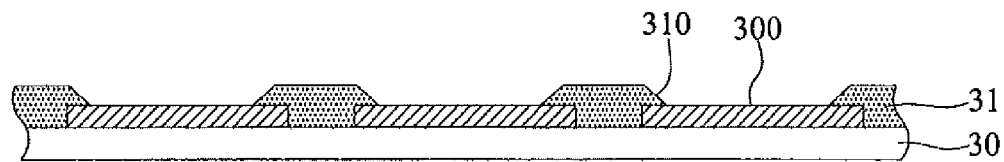
FIGS. 2A to 2H are cross-sectional diagrams illustrating a method of fabricating a connection structure for a substrate according to the present invention.

As shown in FIG. 2A, a substrate 30 having a plurality of connection pads 300 is provided. An insulation protection layer 31 is formed on a surface of the substrate 30 and exposes the connection pads 300.

In an embodiment, the substrate 30 is a semiconductor element, a substrate structure that can be applied to a semiconductor package, a printed circuit board that can be assembled in an electronic element during a second stage, or, preferably, a semiconductor chip or a wafer applied to a flip-chip process.

In an embodiment, the connection pads 300 are copper pads or aluminum pads, and act as input/out ends of an internal circuit of the substrate 30.

Besides, the insulation protection layer 31 further has a plurality of holes 310 formed to expose the connection pads 300. In an embodiment, the insulation protection layer 31 is a polyimide layer or a passivasion layer, and covers a surface of the substrate 30 to protect the substrate 30 from being contaminated or damaged by an ambient environment.

The substrate 30 has a variety of internal structures. In an embodiment, the connection pads 300 are made by the same process. Therefore, the connection pads 300 at only one place are described in the following paragraphs.

Figure 2B:
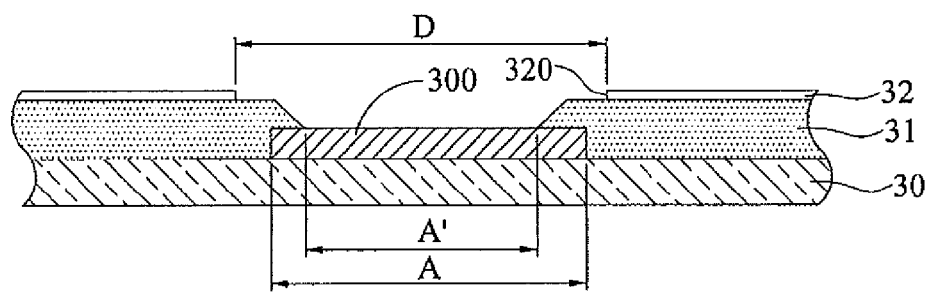

As shown in FIG. 2B, a first resist layer 32 is formed on the insulation protection layer 31, a plurality of first openings 320 are formed on the first resist layer 32, and the connection pads 300 and a portion of the insulation protection layer 31 are exposed from the first openings 320. In an embodiment, the radius size D of the first openings 320 is greater than the projection area A of the connection pads 300 (or the projection area A' of an exposed surface of the connection pads 300).

In an embodiment, the resist layer 32 is formed to cover the insulation protection layer 31 and the connection pads 300 by physical or chemical deposition methods, such as sputtering, evaporation deposition and electroplating, and the resist material corresponding to the connection pads 300 is removed to form the first openings 320.

In an embodiment, the first resist layer 32 is well bonded to the connection pads 300 and the insulation protection layer 31 and is made of metal, such as copper and nickel/vanadium, and the first openings 320 are made by etching.

Figure 2C:
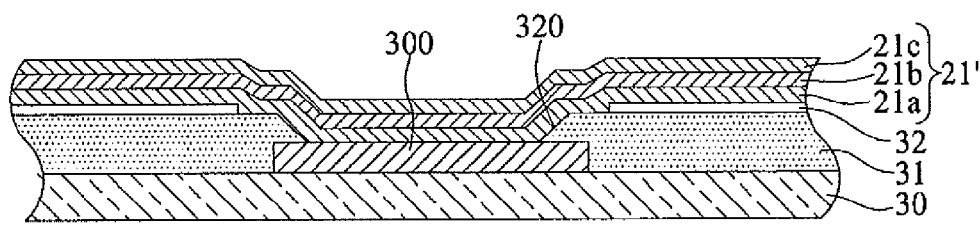

As shown in FIG. 2C, a metallic structure 21' is formed in the first openings 320 and on the first resist layer 32.

In an embodiment, the metallic structure 21' is formed on the first resist layer 32, the insulation protection layer 31 and the connection pads 300 by physical or chemical deposition methods, such as sputtering, evaporation deposition and electroplating, and the metallic structure 21' has any number of layers and any kind of types and acts as an under bump metallurgy (UBM), for the subsequent bumps to be disposed thereon effectively.

In an embodiment, the metallic structure 21' has a three-layer stack structure, including the titanium portion 21a, the copper portion 21b and the nickel portion 21c (i.e., Ti/Cu/Ni), as shown in the drawings, and is fabricated by sputtering, evaporation deposition or electroplating techniques.

Figure 2D:
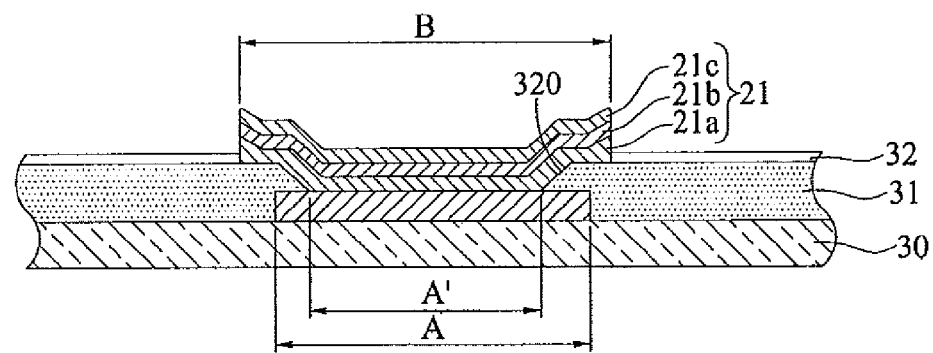

As shown in FIG. 2D, the metallic structure 21' is patterned to define in the first openings 320, a metallic layer 21 (i.e., an UBM structure) formed on the connection pads 300, i.e., removing the metallic structure 21' on the first resist layer 32 and forming the metallic layer 21 on the insulation protection layer 31 and the connection pads 300 in the first openings 320.

In an embodiment, the layout area B of the metallic layer 21 is greater than the projection area A of the connection pads 300 (or the projection area A' of the exposed surface of the connection pads 300).

In the patterning process, a resist layer is first formed on the metallic structure 21', and then exposed and developed for a plurality of openings to be formed therein. Then the metallic structure 21' in the openings is etched and removed, for the metallic layer 21 to be formed on the exposed surfaces of the connection pads 300 and extending to the insulation protection layer 31.

Figure 2E:
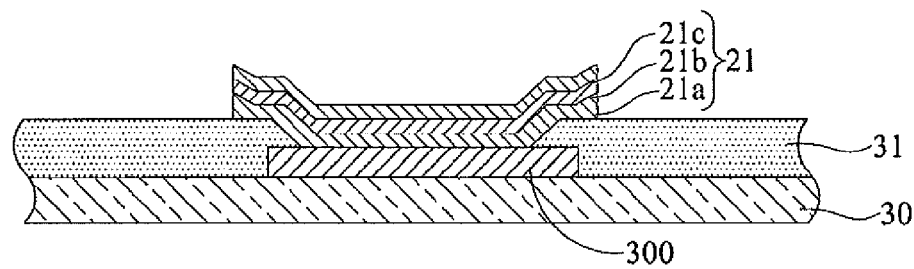

As shown in FIG. 2E, the first resist layer 32 is etched and removed, to expose the entire UBM structure (i.e., the metallic layer 21).

In an embodiment, the metallic layer 21 comprises an adhesion layer (i.e., the titanium portion 21a) formed on the connection pads 300, a barrier layer (i.e., the copper portion 21b) that prevents diffusion, and a wettable layer (i.e., the nickel portion 21c) for bumps to be attached thereto. Therefore, bumps, diffusion barriers and appropriate adhesive material may be disposed between the bumps and the connection pads 300.

In an embodiment, the metallic layer 21 is designed to cover the entire exposed surface of the connection pads 300, and the first resist layer 32 is formed between the metallic structure 21' and the insulation protection layer 31. Therefore, when the metallic structure 21' is etched and removed, only the metal material disposed on the first resist layer 32 needs to be removed, and a residual metal material, except the UBM structure, will not stay on the insulation protection layer 31. Accordingly, when the substrate 30 is flip-chipped on and bonded to the package substrate (or chip) and the chip is in operation, the electrical leakage phenomenon will not occur at the connection structure 2.

Since the metallic layer 21 covers the entire exposed surface of the connection pads 300, a colloid material will not flow to a surface of the connection pads 300 during a subsequent underfill step of a flip-chip process. Therefore, the colloid material will not be peeled off from the substrate 30, the connection structure 2 is prevented from being cracked, and the reliability of an electronic product is prevented from being affected.

Figure 2F:
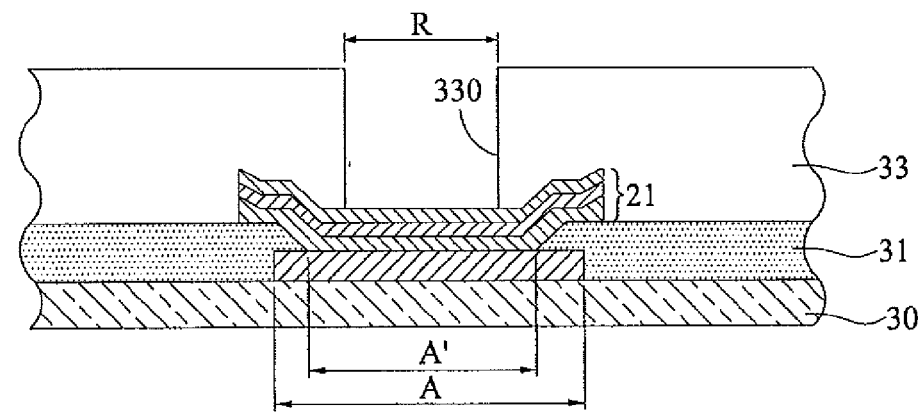

As shown in FIG. 2F, a second resist layer 33 is formed on the insulation protection layer 31 and the metallic layer 21, and second openings 330 are formed on the second resist layer 33 for a portion of a surface of the metallic layer 21 to be exposed therefrom.

In an embodiment, the radius size R of the second openings 330 (i.e., the projection area of the exposed surface of the metallic layer 21) is less than the projection area A of the connection pads 300 (or the projection area A' of the exposed surfaces of the connection pads 300).

Figure 2G:
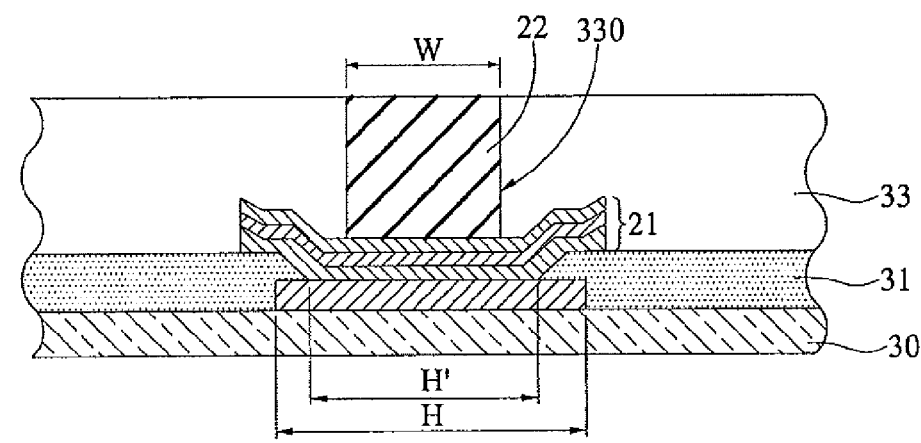

As shown in FIG. 2G, conductive bumps 22 are formed on an exposed surface of the metallic layer 21 of the second openings 330 by electroplating, and the width W of the conductive bumps 22 is less than the width H of the connection pads 300 (or the width H' of the exposed surface of each of the connection pads 300). In an embodiment, the conductive bumps 22 are copper pillars.

Figure 2H:
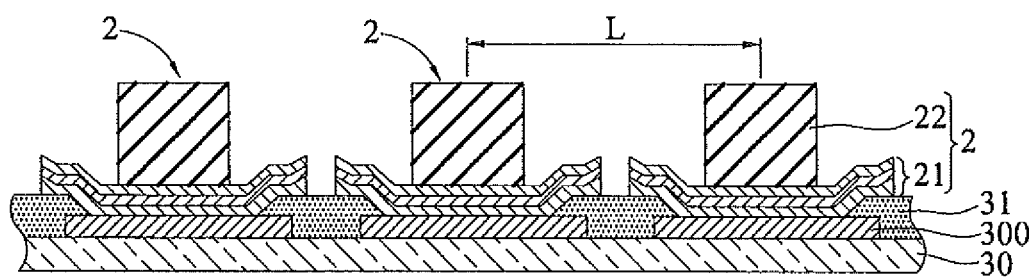

As shown in FIG. 2H, the second resist layer 33 is removed to expose the entire the connection structure 2 (composed of the metallic layer 21 and the conductive bumps 22).

In an embodiment, a distance L between any two of the conductive bumps 22 is less than or equal to 80 µm.

In an embodiment, the present invention provides a connection structure of a substrate 30, the substrate 30 has a plurality of connection pads 300 and an insulation protection layer 31 that exposes the connection pads 300, and the connection structure 2 comprises the metallic layer 21 and the conductive bumps 22.

In an embodiment, the metallic layer 21 is formed on an exposed surface of each of the connection pads 300 and extends to the insulation protection layer 31, and the layout area B of the metallic layer 21 is greater than the projection area A of the connection pads 300. In another embodiment, the metallic layer 21 comprises a titanium portion 21a, a copper portion 21b and a nickel portion 21c.

In an embodiment, the conductive bumps 22 are copper pillars and disposed on the nickel portion 21c of the metallic layer 21, the width W of the conductive bumps 22 is less than the width H of the connection pads 300, and a distance L between any two of the conductive bumps 22 is less than 80 µm.

In a connection structure for a substrate and a method of fabricating the connection structure according to the present invention, since the metallic layer covers the entire exposed surface of the connection pads, no residual metal material will stay on the polyimide except the contacts. Therefore, the reliability and electrical function of an electronic product are not affected, and the peel off problem is overcome.

In a connection structure for a substrate and a method of fabricating the connection structure according to the present invention, a pitch between any two of the conductive bumps is less than 80 µm, in order to avoid the problems of the prior art.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of fabricating a connection structure for a substrate, comprising:
   providing a substrate having a plurality of connection pads and an insulation protection layer formed thereon wherein the connection pads are exposed from the insulation protection layer;
   forming on the insulation protection layer a first resist layer having a plurality of first openings for the connection pads and a portion of the insulation protection layer to be exposed therefrom;
   forming a metallic structure in the first openings and on the first resist layer;
   removing the metallic structure on the first resist layer, allowing the metallic structure to be disposed in the first openings only and act as a metallic layer, the metallic layer being thus formed on exposed surfaces of the connection pads and extending to the insulation protection layer;
   removing the first resist layer; and
   forming a plurality of conductive bumps on the metallic layer, each of the conductive bumps having a width less than a width of the exposed surface of each of the connection pads.

2. The method of claim 1, wherein the first resist layer is made of aluminum, copper, or nickel/vanadium.

3. The method of claim 1, wherein the first openings of the first resist layer are formed by etching.

4. The method of claim 1, wherein the metallic layer is made of titanium, copper or nickel.

5. The method of claim 1, wherein the conductive bumps are copper pillars.

6. The method of claim 1, wherein any two of the conductive bumps are spaced apart from a distance less than or equal to 80 µm.

7. The method of claim 1, wherein the conductive bumps are fabricated by:
   forming a second resist layer on the insulation protection layer and the metallic layer, and forming on the second resist layer a plurality of second openings for a portion of the metallic layer to be exposed therefrom;
   forming the conductive bumps in the second openings; and
   removing the second resist layer.

8. The method of claim 7, wherein each of the second openings has a radius size less than a projection area of the exposed surface of each of the connection pads.

* * * * *